United States Patent
Kim et al.

(10) Patent No.: US 6,613,629 B2
(45) Date of Patent: Sep. 2, 2003

(54) METHODS FOR MANUFACTURING STORAGE NODES OF STACKED CAPACITORS

(75) Inventors: Wan-don Kim, Kyungki-do (KR); Cha-young Yoo, Kyungki-do (KR); Jae-hyun Joo, Seoul (KR); Seok-jun Won, Seoul (JP)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/213,856

(22) Filed: Aug. 7, 2002

(65) Prior Publication Data

US 2003/0032238 A1 Feb. 13, 2003

(30) Foreign Application Priority Data

Aug. 8, 2001 (KR) .................... 2001-0047730

(51) Int. Cl.[7] ......................... H01L 21/8242
(52) U.S. Cl. .............. 438/253; 438/3; 438/240; 438/396
(58) Field of Search .................. 438/238, 239, 438/240, 241, 242, 243, 244, 250, 253, 254, 255, 3, 381, 386, 393, 396, 397, 398, 628, 632, 646, 648; 257/295, 296, 300, 303, 304, 306, 309, 310

(56) References Cited

U.S. PATENT DOCUMENTS 6,001,660 A  * 12/1999  Park et al. ............. 438/3

FOREIGN PATENT DOCUMENTS

JP         10-303397       * 11/1998

* cited by examiner

*Primary Examiner*—Jack Chen
(74) *Attorney, Agent, or Firm*—Myers Bigel Sibley & Sajovec

(57) ABSTRACT

Methods for manufacturing a node of a stacked capacitor are provided. A first dielectric layer having a contact plug therein is formed on an integrated circuit substrate. A second dielectric layer including a storage node hole adjacent the contact plug is formed on the first dielectric layer. A conductive layer is deposited into the storage node hole and on the second dielectric layer. The conductive layer on the second dielectric layer is removed to provide a conductive storage node in the storage node hole. After the conductive layer on the second dielectric layer is removed, the conductive storage node is heat treated to reflow the conductive storage node before additional layers are formed on the conductive storage node.

28 Claims, 11 Drawing Sheets

METHODS FOR MANUFACTURING STORAGE NODES OF STACKED CAPACITORS

RELATED APPLICATION

This application claims priority from Korean Application No. 2001-47730, filed Aug. 8, 2001, the disclosure of which is hereby incorporated herein by reference.

BACKGROUND OF THE INVENTION

The present invention relates to integrated circuit devices and more particularly methods for manufacturing integrated circuit devices including a storage node of a capacitor.

Various integrated circuit devices, including semiconductor memory devices, include one or more capacitors fabricated (manufactured) on the integrated circuit substrate. There is a growing need to increase the capacitance within a limited area as integrated circuit (semiconductor) devices become more highly integrated. Various approaches have been proposed to provide a desired capacitance in a more limited space, for example, to provide increased density of memory cells in an integrated circuit memory device. One proposed approach is a thinning method for reducing the thickness of a dielectric layer. A second approach includes increasing the surface area of an electrode by using a three-dimensional electrode, such as cylinder-type electrode or a fin-type electrode. Another approach is to grow hemispherical grains (HSG) on the surface of an electrode. A further alternative approach is to use a dielectric layer of a high dielectric material having a dielectric constant which is significantly greater than that of a conventional oxide/nitride/oxide (ONO) dielectric.

When a metal-insulator-metal (MIM) capacitor is formed using a dielectric layer made with a high dielectric material, the capacitor is typically fabricated using an electrode formed of a metal of the platinum (Pt) group rather than a conventional polysilicon electrode. For a polysilicon electrode, a low dielectric layer such as a Silicon Oxide ($SiO_N$) layer, capable of suppressing a reaction between the polysilicon electrode and a dielectric layer may be beneficial in obtaining stable leakage current characteristics. As a result, the potential increase in capacitance value using the thinning method may be limited.

In a MIM capacitor a leakage current may be controlled by providing a leakage current barrier layer. Such a layer may result, for example, from a difference in the work function between a metal electrode and a dielectric layer at their interface. Accordingly, stable leakage current characteristics may generally be obtained without the low dielectric layer. Therefore, a greater increase in capacitance may be achieved by thinning the dielectric layer in a MIM capacitor.

Storage nodes of a MIM capacitor can generally be classified into three types: a concave storage node, a cylindrical storage node and a stacked storage node. Of these types of storage nodes, the concave storage node is typically the easiest to manufacture and planarize. However, in a typical concave storage node, only the inner wall of a storage node serves as a charging area. Therefore, it may be difficult to obtain a large capacitance, as the design rule applied to such devices may be very small.

The cylindrical storage node may be advantageous in that both the outer and inner walls of the storage node may serve as a charging area. Thus, the height of the electrode of the cylindrical storage node may be lower than with the other types of storage nodes identified above. However, a cylindrical storage node may be difficult to configure stably and the size of the inner wall of its electrode typically is generally reduced as the design rules applied to such device get smaller. This may, eventually, result in the storage node being more properly categorized as a stacked storage node.

The stacked storage node generally has the most stable structure of the types of storage nodes discussed above and can generally be implemented with a finer (smaller) design rule than the other types of storage nodes. However, a stacked storage node may be difficult to manufacture, for example, because it may be hard to etch a platinum group metal used as an electrode of the stacked storage node.

It is known to form a dielectric layer having a contact plug therein on a semiconductor wafer in which a conductive region is formed during the manufacture of a stacked storage node. An etch stopper material layer and a sacrificial insulating material layer may subsequently be sequentially formed on the dielectric layer. Predetermined portions of the sacrificial insulating material layer and the etch stopper material layer may then be etched, thereby providing a structure including an etch stopper, a sacrificial dielectric layer, and a storage node hole exposing the contact plug.

After formation of the storage node hole, a relatively thick metal layer of a platinum group material is typically deposited on the integrated circuit substrate (semiconductor wafer), thereby filling the storage node hole, preferably completely. However, a void or seam may form in the metal layer in the storage node hole. As an increase of the capacitance of the stacked capacitor is typically provided by increasing the depth of the storage node hole relative to its diameter, its aspect ratio increase, which may increase the difficulty of filling the storage node hole with the metal layer without forming a void or seam.

In a conventional manufacturing process, the metal layer deposited on the sacrificial dielectric layer is removed by etch back or chemical-mechanical polishing (CMP) after deposition to form a storage node in the storage node hole as the metal is not removed from the storage node hole by the removal process. The sacrificial dielectric layer is then removed and a dielectric layer and an upper electrode are sequentially formed on the integrated circuit device including the stacked storage node.

As a void or seam may form in the storage node of the conventional stacked capacitor storage node, the inner portion of the storage node typically may not be formed only of conductive materials. As a result, the storage node may be structurally weak and subject to being bent or being deformed during a subsequent high-temperature heating process. In addition, the electrical characteristics of the storage node may deteriorate due to an increase in resistance.

A conventional process for forming a storage node will now be described with reference to FIGS. 1 and 2A–2E. FIG. 1 is a scanning electron microscope (SEM) photograph of a storage node manufactured by a conventional method, taken at an oblique angle. As shown in the photograph, a seam 110 is present in the storage node 100. To reduce the risk/severity of such seams in a typical conventional process, a reflow process was used in which the storage node is heated to a high temperature.

FIGS. 2A through 2E are cross-sectional diagrams illustrating conventional manufacturing operations for forming a stacked capacitor to reduce or eliminate the occurrence of voids or seams. As illustrated in FIG. 2A, a contact plug 330 is formed on a portion of an integrated circuit substrate 300. A conductive region 310 is positioned in the integrated circuit substrate 300, which is contacted by the contact plug 330. A first dielectric layer 320 is formed on the remaining illustrated portions of the integrated circuit substrate 300 adjacent the contact plug 330 to define the contact plug 330 therein. An etch stopper material layer and a sacrificial insulating material layer are sequentially formed on the dielectric layer 320 and regions of these layers are etched to form, respectively, a second, sacrificial dielectric layer 350 and an etch stopper 340, which define a storage node hole 360 adjacent to and exposing the contact plug 330.

As shown in FIG. 2B, a metal layer 370, which may be formed of a metal selected from the platinum group, is deposited into the storage node hole 360 and on the sacrificial dielectric layer 350. The metal layer 370 may be deposited as a thick layer, for example, to a thickness of about 1000 angstroms (Å) or more. However, as illustrated by the void (or seam) 380 in FIG. 2B, the storage node hole 360 may not be entirely filled by the deposited metal layer 370.

To address the problem of the void 380, as illustrated in FIG. 2C, a reflow process is performed by heating the integrated circuit substrate (semiconductor wafer) and the layers formed thereon to, typically, 650° C. or more. It may be possible to fill the storage node hole 360 completely with the metal material of the metal layer 370 and eliminate the void 380 using the reflow process. The metal layer 370, after the reflow process, is identified in FIG. 2C by reference numeral 378. As shown in FIG. 2D, the portions of the metal layer 378 on the sacrificial dielectric layer 350 (and above the storage node hole 360) are removed, for example, by etch back or CMP, to provide the storage node 375.

Operations related to completing fabrication of a stacked capacitor including the storage node 375 are further illustrated in FIG. 2E. As shown in FIG. 2E, the sacrificial dielectric layer 350 is removed. A third dielectric layer 390 and an upper electrode 400, of a conductive material, are sequentially formed on the conductive storage node 375 to provide a stacked capacitor.

With the conventional process described above, the adhesion characteristics at the interface between the metal layer 378, including the storage node 375, and the sacrificial dielectric layer 350 may not be sufficient to retain its integrity. As a result, lifting may occur when the metal layer 378 is not completely adhered to the sacrificial dielectric layer 350. In particular, the probability of such lifting may increase during the reflow process when the metal layer 378 is heated at a high temperature. Accordingly, during the reflow process, there is a significant risk that lifting will occur at the interface between the metal layer 378 and the sacrificial dielectric layer 350.

SUMMARY OF THE INVENTION

Embodiments of the present invention include methods for manufacturing a node of a stacked capacitor. A first dielectric layer having a contact plug therein is formed on an integrated circuit substrate. A second dielectric layer including a storage node hole adjacent the contact plug is formed on the first dielectric layer. A conductive layer is deposited into the storage node hole and on the second dielectric layer. The conductive layer on the second dielectric layer is removed to provide a conductive storage node in the storage node hole. After the conductive layer on the second dielectric layer is removed, the conductive storage node is heat treated to reflow the conductive storage node before additional layers are formed on the conductive storage node.

In other embodiments of the present invention, depositing of the conductive layer is preceded by forming an adhesive layer on the second dielectric layer. The adhesive layer is removed with the second dielectric layer. Heat treating of the conductive storage node may be followed by removing the second dielectric layer and sequentially forming a dielectric layer and an upper electrode on the conductive storage node to provide a stacked capacitor.

The conductive storage node may be heat treated at about 650° Centigrade (C.) to about 900° C. The heat treatment may occur in at least one of an argon, hydrogen, nitrogen or oxygen atmosphere and may occur in a vacuum state. The conductive layer may be removed by at least one of etch back or chemical-mechanical polishing (CMP). The conductive layer may be deposited by at least one of CMP, physical vapor deposition (PVD), or atomic layer deposition (ALD).

In further embodiments of the present invention, methods are provided for fabricating a stacked capacitor on a semiconductor wafer. A dielectric layer having a contact plug therein is formed on the semiconductor wafer. A sacrificial dielectric layer including a storage node hole for exposing the contact plug is formed on the dielectric layer. The storage node hole is filled with a conductive material. A storage node is formed by removing the conductive material formed on the sacrificial dielectric layer. The storage node is reflowed by heat treatment. The sacrificial dielectric layer encompassing the storage node is removed and a dielectric layer and an upper electrode are sequentially formed on the storage node.

An etch stopper may be included between the dielectric layer and the sacrificial dielectric layer. The storage node hole may be formed by one or a combination of a CMP method, a physical vapor deposition (PVD) method, and an atomic layer deposition (ALD) method. The dielectric layer and the upper electrode may be formed by the CVD method or ALD method.

The semiconductor wafer, including the dielectric layer, may be annealed in an ozone atmosphere or in an oxygen or nitrogen atmosphere between forming the dielectric layer and forming the upper electrode. The semiconductor wafer, including the dielectric layer, may be heat treated at 500–800° C. in an oxygen or nitrogen atmosphere between forming the dielectric layer and forming the upper electrode. The semiconductor wafer, with the upper electrode, may be heat treated at 300–600° C. in an oxygen atmosphere after the upper electrode is formed.

BRIEF DESCRIPTION OF THE DRAWINGS

Other features of the present invention will be more readily understood from the following detailed description of the invention when read in conjunction with the accompanying drawings, in which.

DETAILED DESCRIPTION OF THE INVENTION

Figure 1:
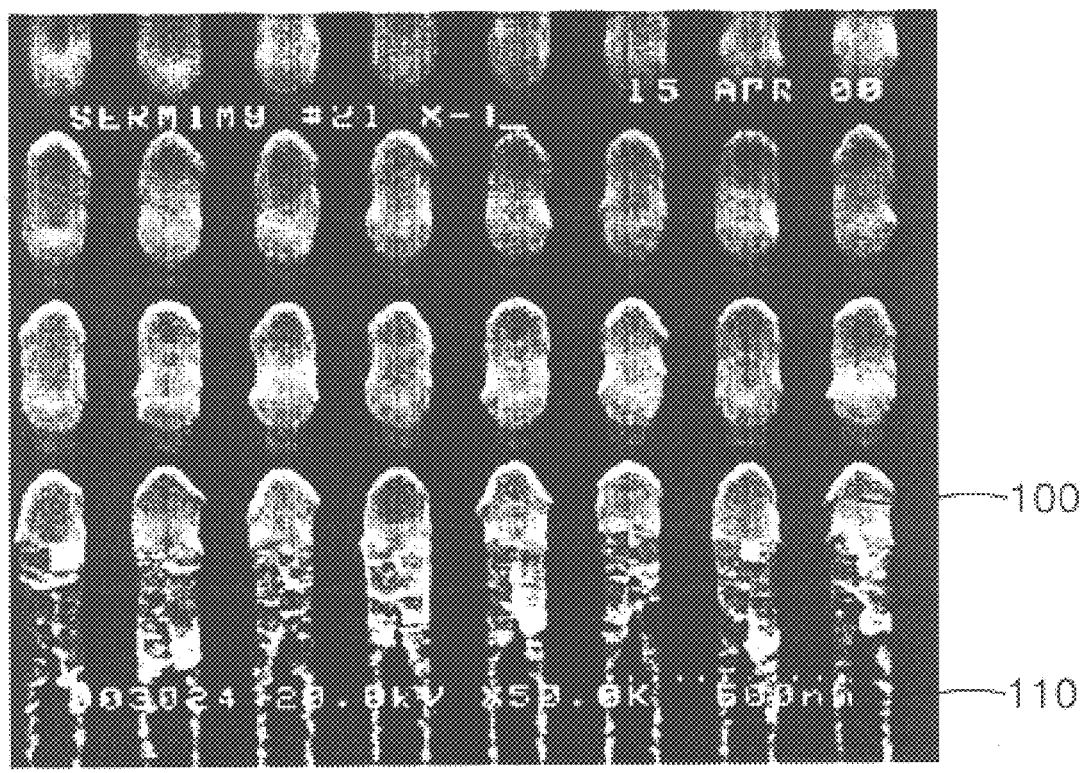
FIG. 1 is a scanning electron microscope (SEM) photograph of a stacked capacitor formed according to a conventional method.

The present invention now will be described more fully hereinafter with reference to the accompanying drawings, in which typical embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of regions may be exaggerated for clarity. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well. Terms used herein are to be given their ordinary meaning unless explicitly defined otherwise herein.

Integrated circuit devices and methods for forming such devices in accordance with embodiments of the present invention will now be described with reference to FIGS. 3A–3E. In particular, FIGS. 3A–3E illustrate embodiments of operations for manufacturing a storage node and a stacked capacitor including the storage node. As used herein, the term "storage node" refers to an electrode of a capacitor.

Figure 3A:
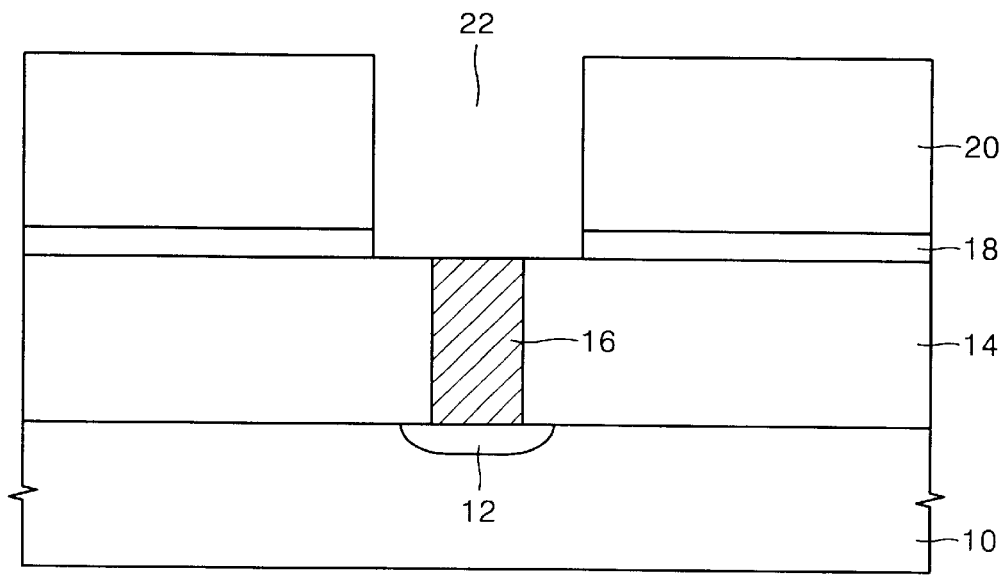
FIGS. 3A through 3E are cross-sectional diagrams illustrating manufacturing of a stacked capacitor according to embodiments of the present invention.

As shown in FIG. 3A, a first dielectric layer 14, having a contact plug 16 therein, is formed on a portion of an integrated circuit substrate (semiconductor wafer) 10. More particularly, the contact plug 16 is positioned adjacent and contacting a conductive region 12 formed in the integrated circuit substrate 10. The dielectric layer 14 may be formed of an oxide layer, such as a high-density plasma (HDP) layer or a plasma-enhanced tetraethylorthosilicate (PETEOS) layer. An etch stopper material layer and a sacrificial insulating material layer may be sequentially formed on the dielectric layer 14. SiN and a PETEOS layer may be used as the etch stopper material layer and the sacrificial insulating material layer, respectively. Next, the etch stopper material layer and the sacrificial insulating material layer are etched to define an etch stopper 18 and a second, sacrificial dielectric layer 20, which define a storage node hole 22 adjacent the contact plug 16.

Figure 3B:
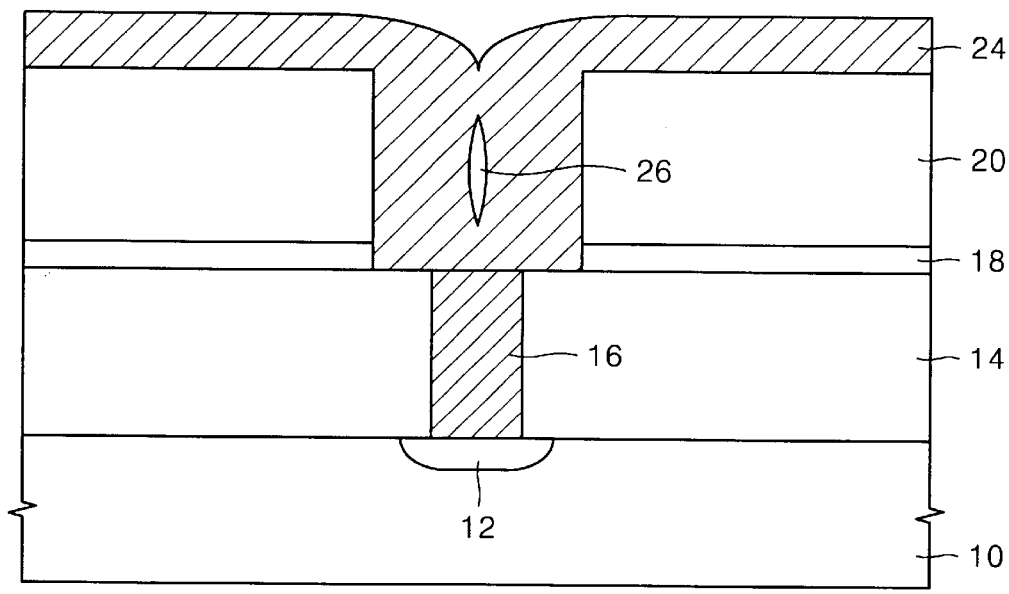

Referring now to FIG. 3B, the storage node hole 22 is filled with a conductive layer 24 to form a storage node. The conductive layer 24 may be a metal layer formed as a single or composite layer and the material may be selected from the group consisting of Platinum (Pt), Ruthenium (Ru), Iridium (Ir), Platinum Oxide (PtO), Ruthenium Oxide (RuO$_2$), Iridium Oxide (IrO$_2$), Strontium Ruthenium Oxide (SRO), Bismuth Strontium Ruthenium Oxide (BSRO), and Lanthanum Strontium Cupperate (LSCo). The conductive layer 24 may be deposited as a thick layer so as to fill the storage node hole 22, for example, by one or more of chemical vapor deposition (CVD), physical vapor deposition (PVD), and/or atomic layer deposition (ALD).

As shown in FIG. 3B, a void (or seam) 26 is left after depositing the conductive layer 24. Such a void 26 may result, for example, when manufacturing a capacitor having an increased capacitance provided by a relatively high aspect ratio of the storage node hole 22. Generally, the storage node hole 22 cannot be completely filled when the aspect ratio thereof becomes too high (i.e., greater depth relative to width making the deposition process of a conductive layer therein more difficult).

Figure 3C:
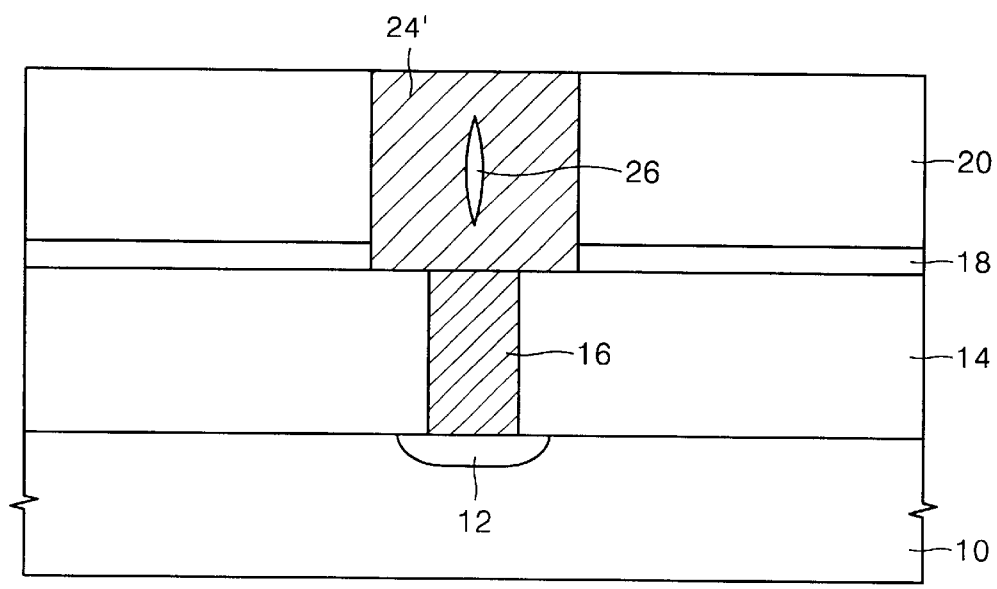

Referring now to FIG. 3C, the conductive layer 24 on the sacrificial dielectric layer 20 (and above the storage node hole 22) is removed, for example, by etch back or CMP, to provide a conductive storage node 24' in the storage node hole 22.

In accordance with the illustrated embodiments of the present invention, the portions of the conductive layer 24 not in the storage node hole 22 are removed before reflow heat treating of the conductive storage node 24' (or other subsequent heating processes associated with adding additional layers on the conductive storage node 24') to reduce or eliminate the void 26. As a result, lifting at the interface between the conductive layer 24 and the sacrificial dielectric layer 20 may be reduced or even eliminated.

Figure 3D:
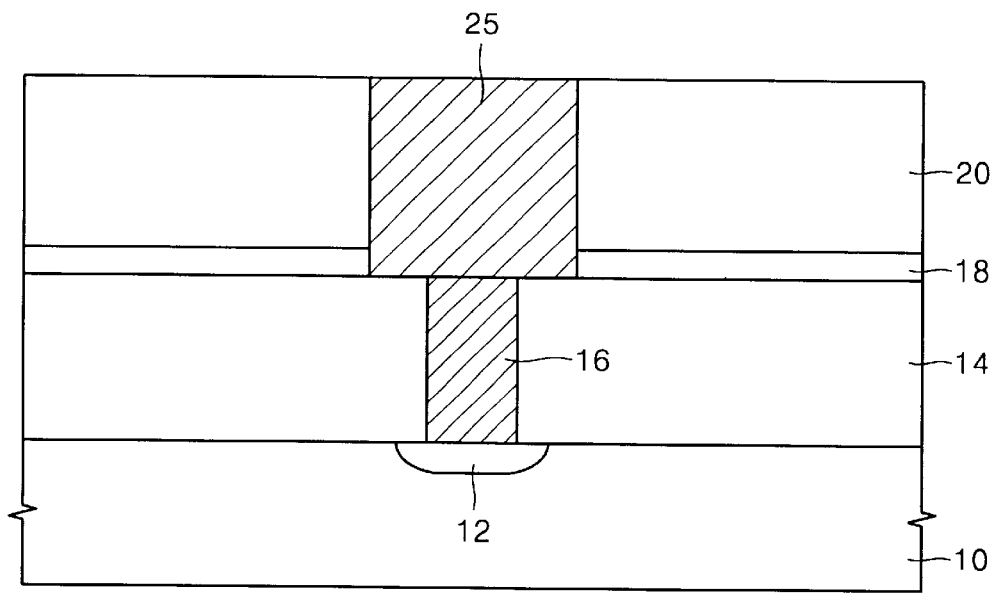

As shown in FIG. 3D, the conductive storage node 24' of FIG. 3C, including the void 26, is heat treated to reflow the conductive storage node 24' to provide a conductive storage node 25 with the void 26 reduced or eliminated. The reflow process may including heating the storage node 24' to a temperature from about 650° Centigrade (C.) to about 900° C. The heat treating reflow process may be performed in an argon (Ar), hydrogen, nitrogen or oxygen atmosphere or may be performed in a vacuum state.

Figure 2A:
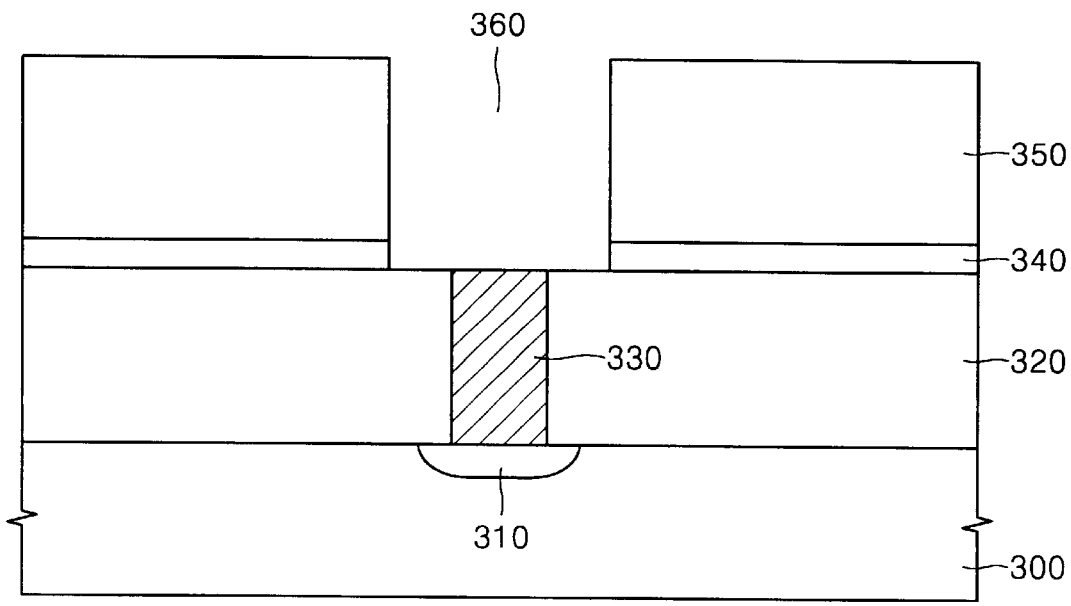
FIGS. 2A through 2E are cross-sectional diagrams illustrating a conventional method of fabricating a stacked capacitor.
Figure 2B:
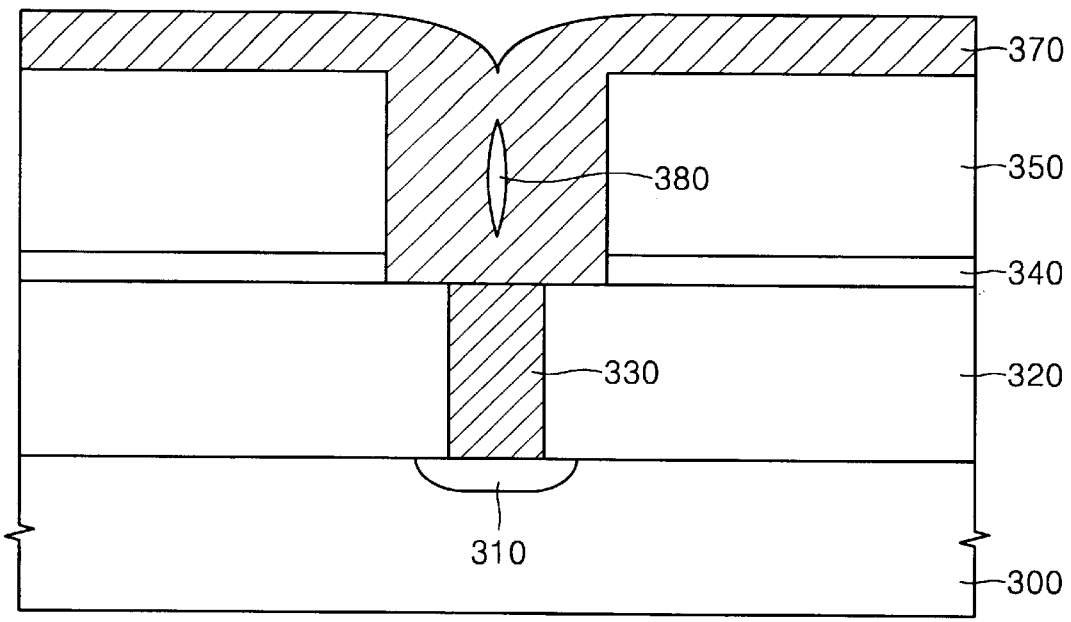
Figure 2C:
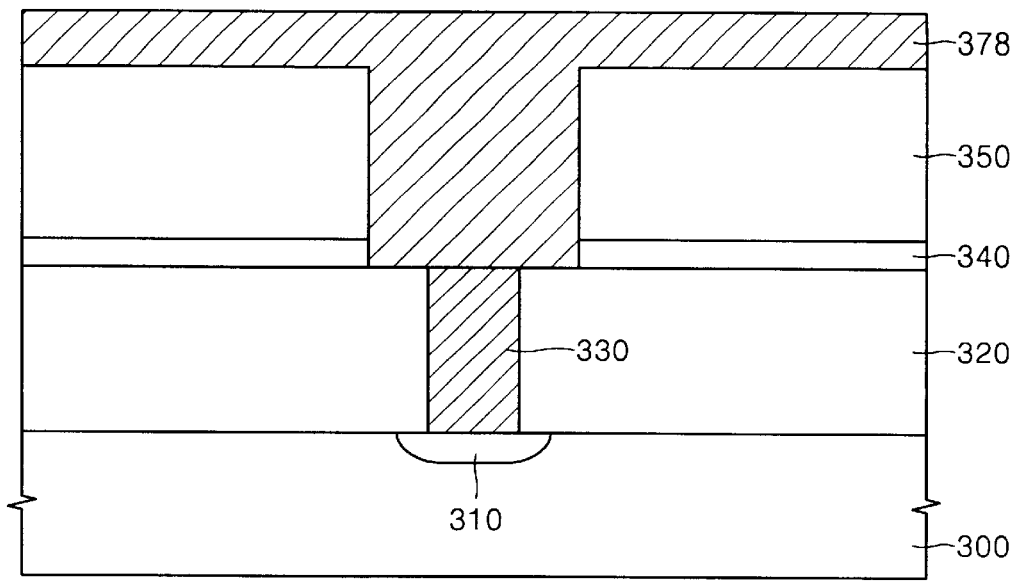
Figure 2D:
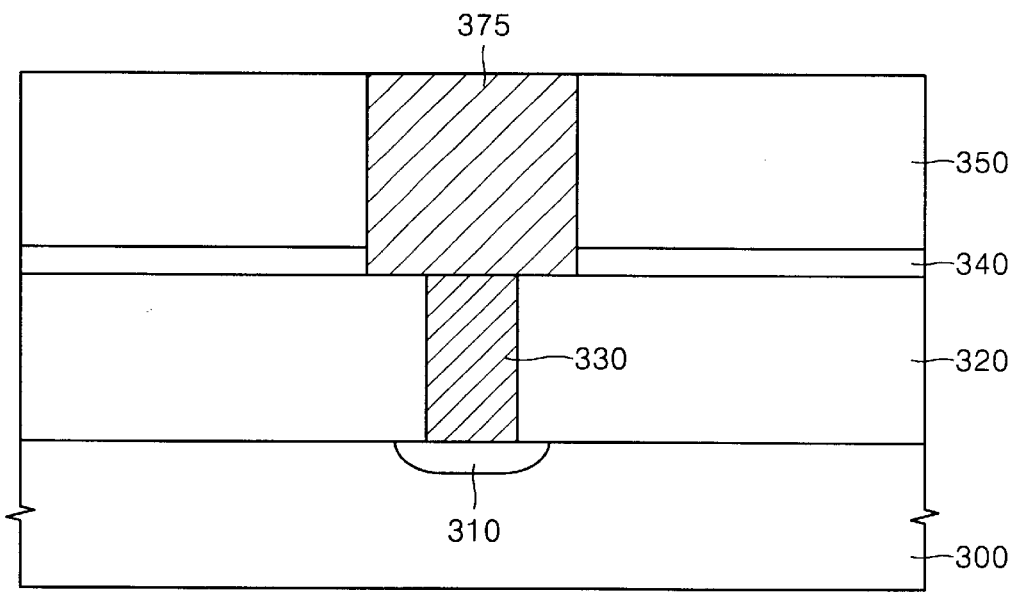
Figure 2E:
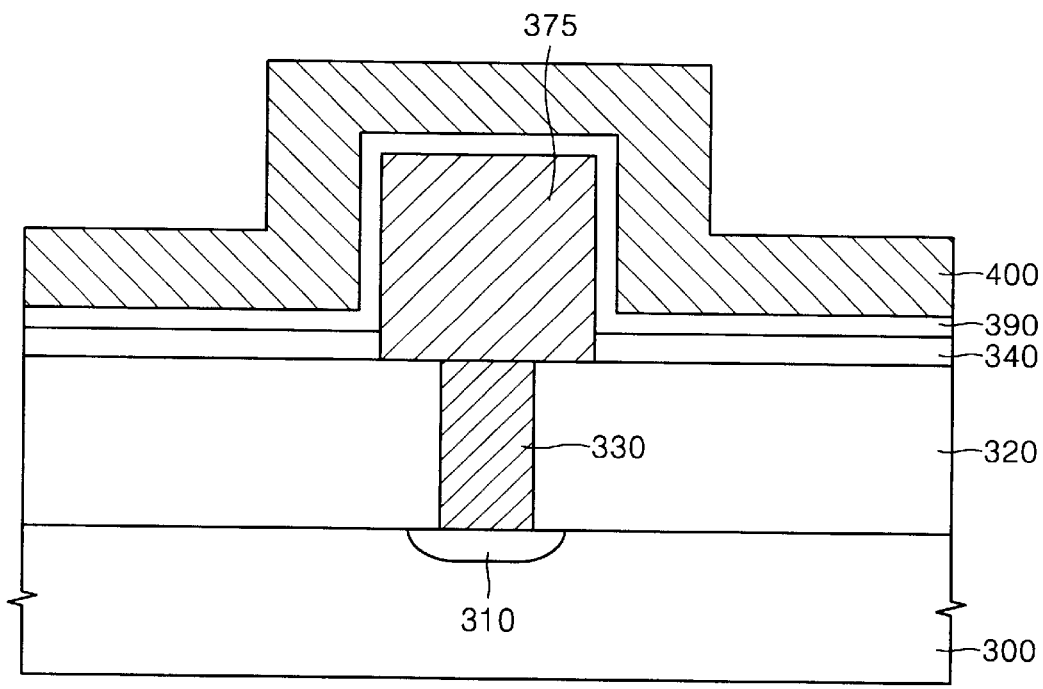

As described with reference to FIGS. 3A–3D, as the conductive layer 24 on the sacrificial dielectric layer 20 was removed before the reflow process, lifting may not occur at the interface between the sacrificial dielectric layer 20 and the conductive layer 24. Furthermore, rolling of a lower portion of the storage node 24' may be reduced as compared to conventional manufacturing operations where the storage node 24' is heated while the metal layer 378 (FIG. 2C) is still on the sacrificial dielectric layer 350 (FIG. 2C).

Figure 3E:
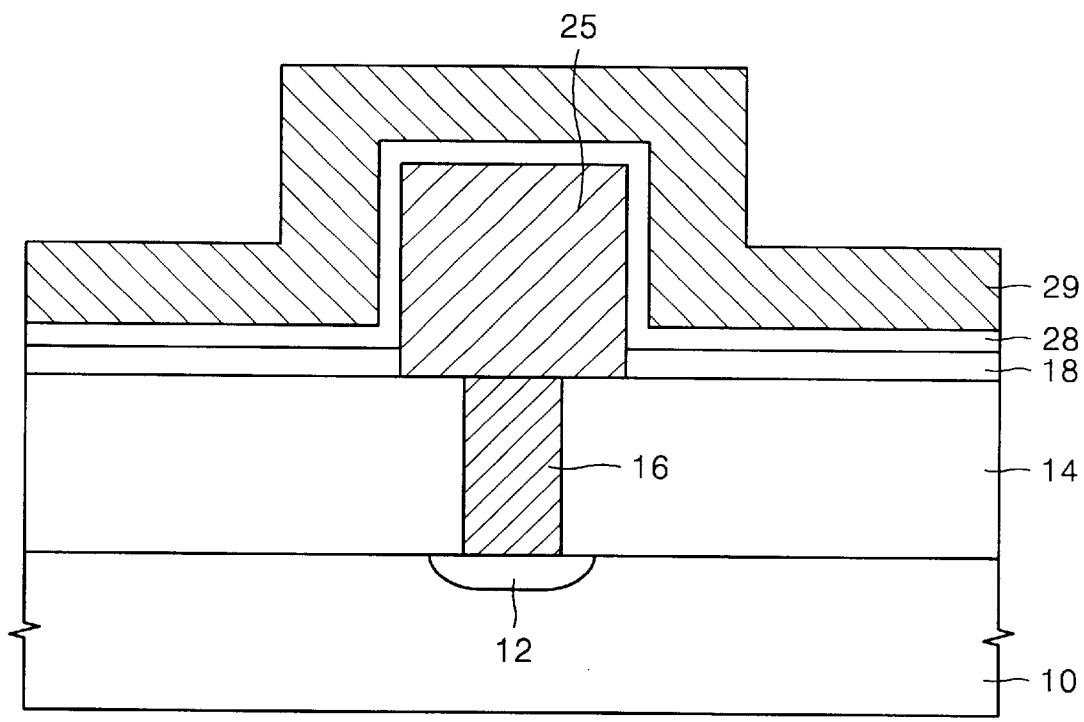

Referring now to FIG. 3E, additional operations related to fabricating a stacked capacitor on the integrated circuit substrate 300 will now be described. As shown in FIG. 3E, the sacrificial dielectric layer 20 has been removed. Subsequently, a third dielectric layer 28 and an upper electrode 29 are sequentially formed on the conductive storage node 25 to provide a stacked capacitor. The third dielectric layer 28 may be formed of a single or composite film, which may be selected from the group consisting of a Tantalum Oxynitride (TaON) film, a Tantalum Pentoxide (Ta$_2$O$_5$) film, an Aluminum Oxide (Al$_2$O$_3$) film, a Strontium Titanate (SrTiO$_3$, i.e., STO) film, a Barium, Strontium, Titante 9(Ba,Sr)TiO$_3$, i.e., BST) film, a Lead Titanate (PbTiO$_3$) film, Lead Zirconia, Titanate (Pb(Zr,Ti)O$_3$) film, an Strontium Bismuth Tantalum Oxide (SrBi$_2$Ta$_2$O$_9$, i.e., SBT) film, a Lead, Lanthanum Zirconia, Titanate ((Pb,La)(Zr,Ti)O$_3$) film, and a Barium Titanate (BaTiO$_3$, i.e., BTO) film. The upper electrode may be formed of a single or composite film and may be selected from the group consisting of Platinum (Pt), Ruthenium (Ru), Iridium (Ir), Platinum Oxide (PtO), Ruthenium Oxide (RuO$_2$), Iridium Oxide (IrO$_2$), Strontium Ruthenium Oxide (SRO), Bismuth Strontium Ruthenium Oxide (BSRO), and Lanthanum Strontium Cupperate (LSCo). The dielectric layer 28 and/or the upper electrode 29 may be formed by, for example, the CVD or ALD method.

It is to be understood that the dielectric layer 28 may be annealed before the upper electrode 29 is formed. The annealing process may include placing the integrated circuit substrate 10 and the structures thereon, including the dielectric layer 28, in an ozone atmosphere with ozone processed with plasma in an oxygen or nitrogen atmosphere, or heated at about 500° C. to about 800° C. in an oxygen or nitrogen atmosphere. In addition, after forming the upper electrode 29, integrated circuit device of FIG. 3E may be heated, for example, at about 300° C. to about 600° C. in an oxygen atmosphere. Such additional processing steps while manufacturing a stacked capacitor may provide a more uniform surface to the dielectric layer 28, which may enhance the electrical characteristics of the stacked capacitor.

Further embodiments of the present invention will now be described with reference to FIGS. 4A–4E. The embodiments illustrated in FIGS. 4A–4E differ from those described above with reference to FIGS. 3A–3E in that an adhesive layer is further included, which may strengthen the adhesion characteristics at an interface between a conductive layer and a sacrificial dielectric layer during the fabrication of a storage node of a capacitor.

Figure 4A:
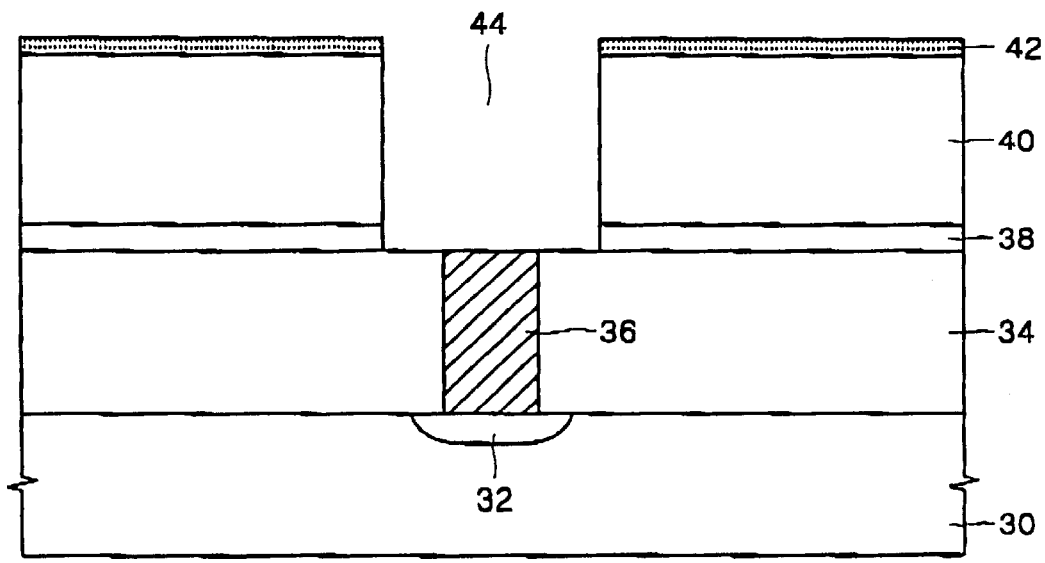
FIGS. 4A through 4E are cross-sectional diagrams illustrating manufacturing of a stacked capacitor according to further embodiments of the present invention.

As shown in FIG. 4A, a first dielectric layer 34, including a contact plug 36 therein, is formed on an integrated circuit substrate (semiconductor wafer) 30. The contact plug 36 is formed adjacent a conductive region 32 formed in the integrated circuit substrate 30. An etch stopper material layer, a sacrificial insulating material layer and an adhesive material layer are sequentially formed on the first dielectric layer 34 and etched to provide the etch stopper 38, the second, sacrificial dielectric layer 40 and the adhesive layer 42. The etching process provides the storage node hole 44 positioned adjacent to and exposing the contact plug 36. Thus, the storage node hole 44 is defined by the etch stopper 38, the sacrificial dielectric layer 40, and the adhesive layer 42.

Figure 4B:
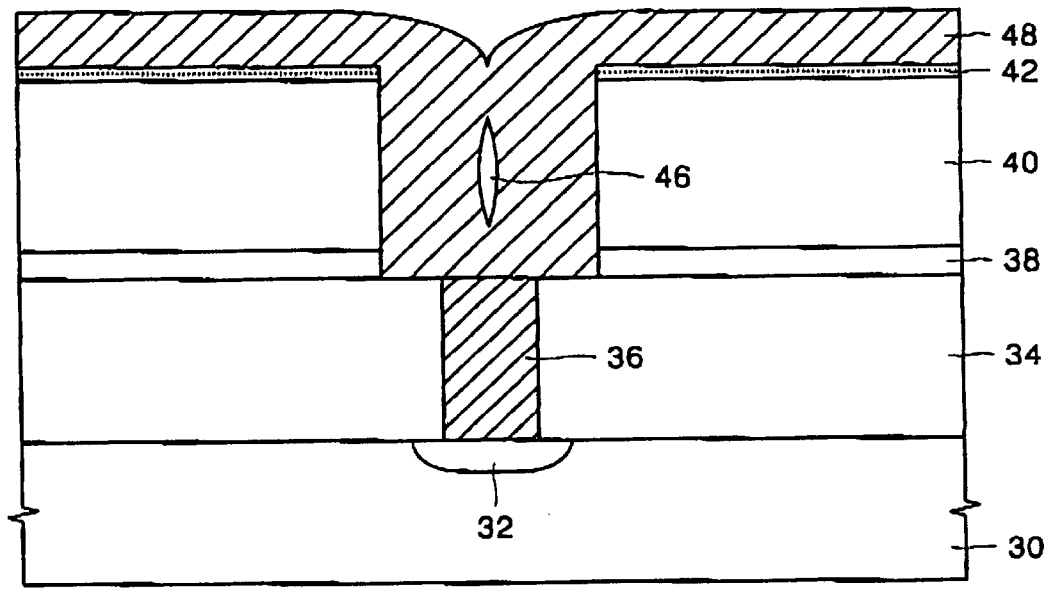
Figure 4C:
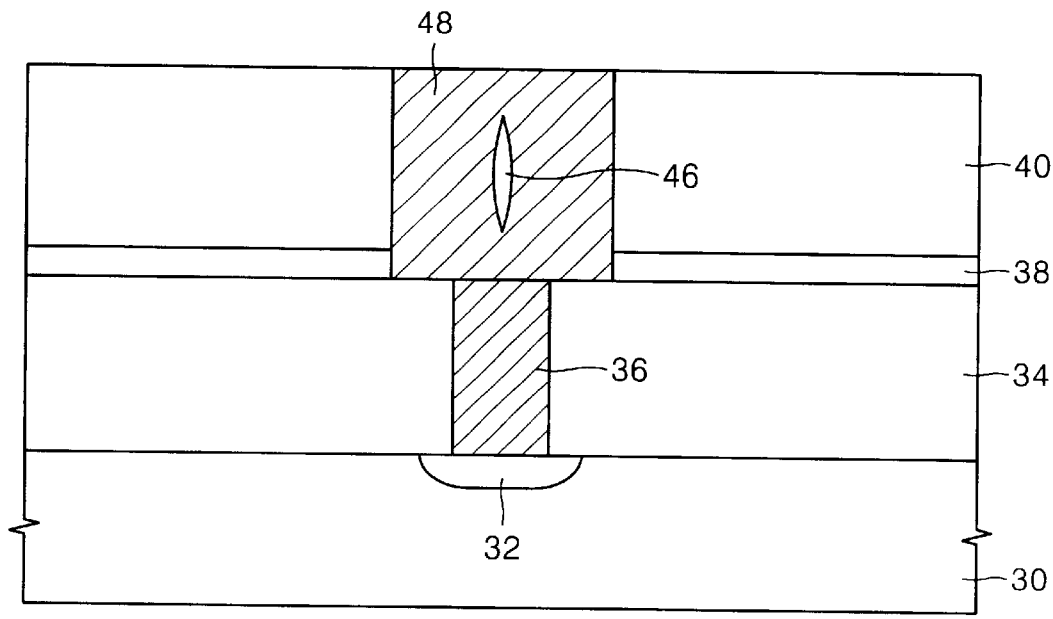
Figure 4D:
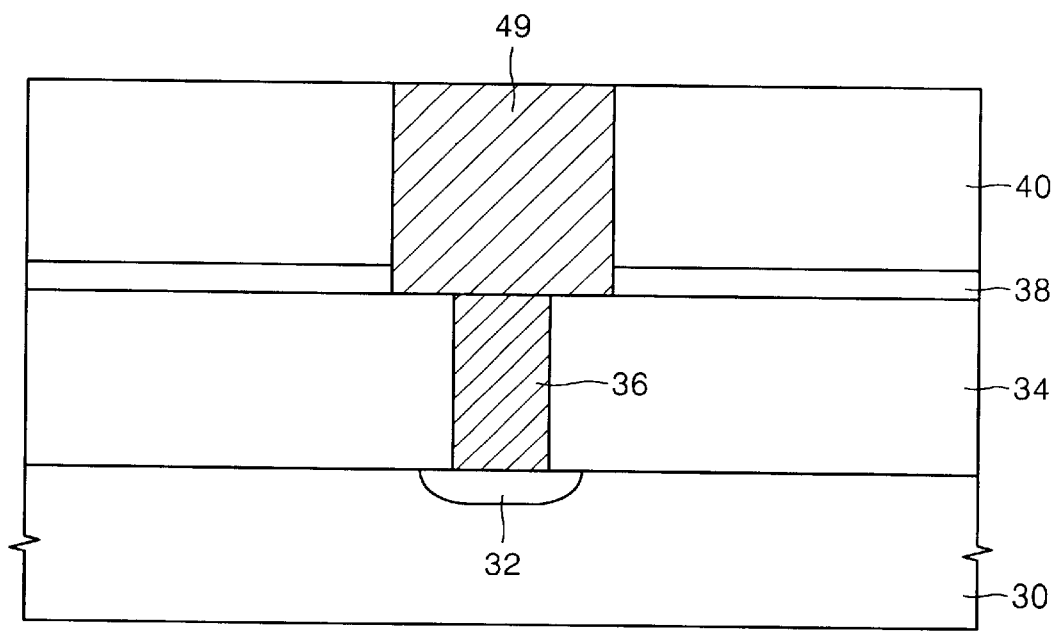
Figure 4E:
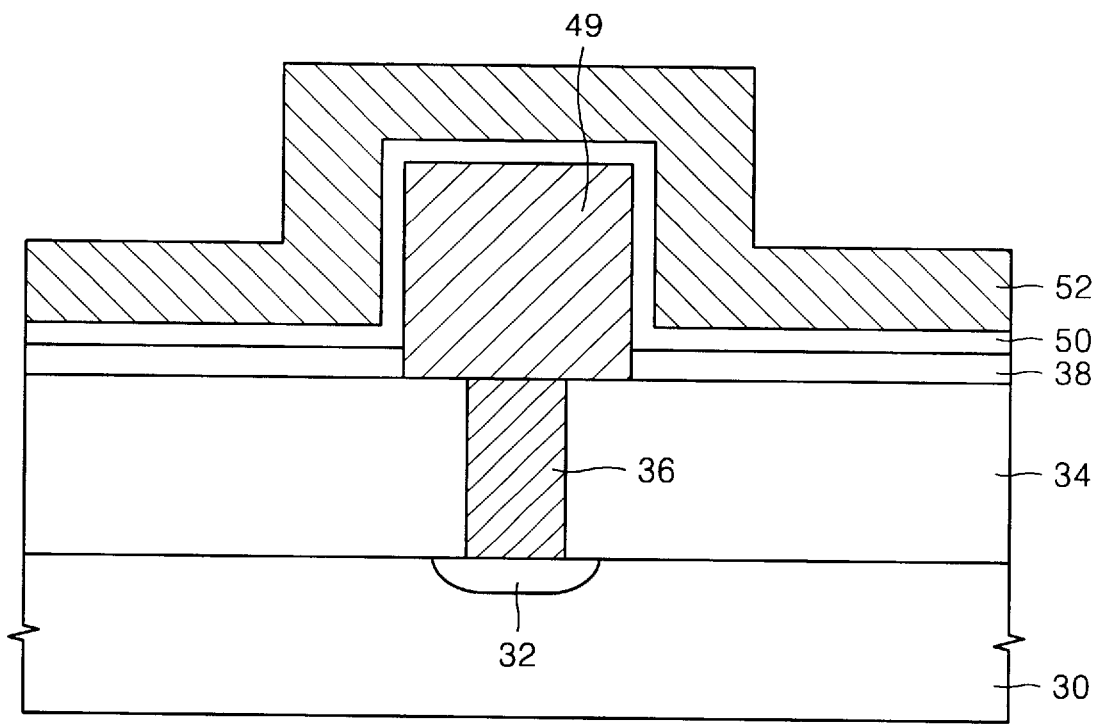

The adhesive layer 42 may be selected to enhance the adhesive characteristics of the interface between the sacrificial dielectric layer 40 and the conductive, for example, metal layer 48 (FIG. 4B). Lifting may, thereby, be reduced or eliminated when forming the conductive layer 48. The adhesive layer 42 may be formed of a film selected from the group consisting of a Tantalum Pentoxide ($Ta_2O_5$) film, a Tantalum Oxynitride (TaON) film, a Titanate (TiOx) film, a Barium, Strontium, Titanate ((Ba,Sr)TiO2, i.e., BST) film, a Titanium Nitride (TiN) film, and a Strontium Titanate ($SrTiO_3$, i.e., STO) film. The adhesive layer 42 may be retained or etched away along with the conductive layer 48 during subsequent process steps.

The processes illustrated in FIGS. 4B through 4E are, otherwise, generally the same as those described with reference to FIGS. 3B through 3E and, therefore, need not be further described herein.

Figure 5:
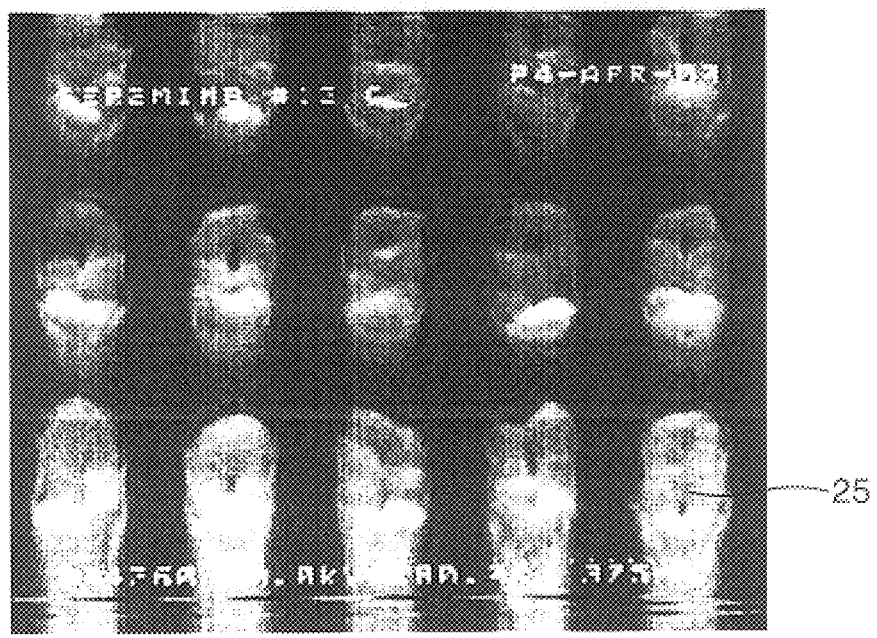
FIGS. 5 and 6 are SEM photographs of a storage node manufactured according to embodiments of the present invention.
Figure 6:
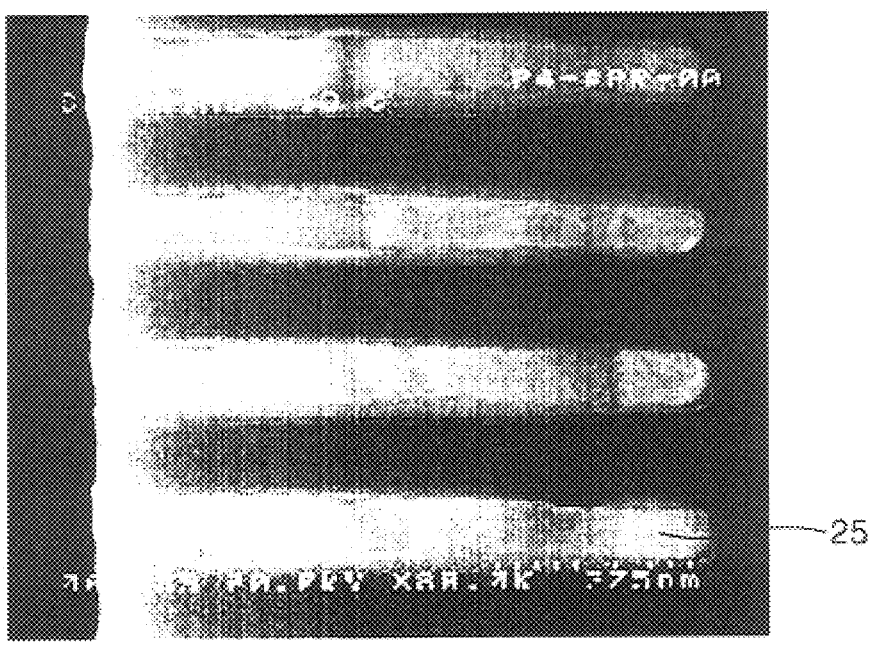

FIGS. 5 and 6 are SEM photographs of storage nodes manufactured according to embodiments of the present invention. FIG. 5 is a photograph of the storage node taken at an oblique angle. FIG. 6 shows the cross-section of the storage node. As shown in FIGS. 5 and 6, no void or seam is seen in the storage node 25. Furthermore, little or no rolling up of the conductive layer of the storage node 25 is seen.

It should be noted that many variations and modifications may be made to the embodiments described above without substantially departing from the principles of the present invention. All such variations and modifications are intended to be included herein within the scope of the present invention, as set forth in the following claims.

We claim:

1. A method of manufacturing a node of a stacked capacitor, the method comprising:

forming a first dielectric layer having a contact plug therein on an integrated circuit substrate;

forming a second dielectric layer including a storage node hole adjacent the contact plug on the first dielectric layer;

depositing a conductive layer into the storage node hole and on the second dielectric layer;

removing the conductive layer on the second dielectric layer to provide a conductive storage node in the storage node hole; and then heat treating the conductive storage node to reflow the conductive storage node before additional layers are formed on the conductive storage node.

2. The method of claim 1 wherein depositing a conductive layer is preceded by forming an adhesive layer on the second dielectric layer and wherein removing the conductive layer on the second dielectric further comprises removing the adhesive layer on the second dielectric layer.

3. The method of claim 2 wherein heat treating the conductive storage node is followed by:

removing the second dielectric layer; and sequentially forming a dielectric layer and an upper electrode on the conductive storage node to provide a stacked capacitor.

4. The method of claim 1 wherein heat treating the conductive storage node is followed by:

removing the second dielectric layer; and sequentially forming a dielectric layer and an upper electrode on the conductive storage node to provide a stacked capacitor.

5. The method of claim 1 wherein heat treating the conductive storage node comprises heat treating the conductive storage node at about 650° Centigrade (C.) to about 900° C.

6. The method of claim 5 wherein heat treating the conductive storage node comprises heat treating the conductive storage node at about 650° Centigrade (C.) to about 900° C. in at least one of an argon, hydrogen, nitrogen or oxygen atmosphere.

7. The method of claim 5 wherein heat treating the conductive storage node comprises heat treating the conductive storage node at about 650° Centigrade (C.) to about 900° C. in a vacuum state.

8. The method of claim 1 wherein the conductive storage node comprises a material selected from the group consisting of Pt, Ru, Ir, PtO, RuO2, SRO, BSRO, and LSCo.

9. The method of claim 8 wherein removing the conductive layer on the second delectric layer is performed by at least one of etch back or chemical-mechanical polishing (CMP).

10. The method of claim 8 wherein depositing a conductive layer comprises depositing the conductive layer by at least one of chemical vapor deposition (CVD), physical vapor deposition (PVD), or atomic layer deposition (ALD).

11. A method of fabricating a stacked capacitor on a semiconductor wafer, the method comprising:

forming a first dielectric layer having a contact plug therein on the semiconductor wafer;

forming a sacrificial dielectric layer including a storage node hole for exposing the contact plug on the first dielectric layer;

filling the storage node hole with a conductive material;

forming a storage node by removing the conductive material formed on the sacrificial dielectric layer;

reflowing the storage node by heat treatment;

removing the sacrificial dielectric layer encompassing the storage node; and sequentially forming a second dielectric layer and an upper electrode on the storage node.

12. The method of claim 11, wherein the reflowing of the storage node is performed at 650–900° C. in an argon, hydrogen, or nitrogen atmosphere.

13. The method of claim 12, wherein an etch stopper is further included between the first dielectric layer and the sacrificial dielectric layer.

14. The method of claim 12, wherein forming the storage node is performed by etch back or chemical-mechanical polishing (CMP).

15. The method of claim 11, wherein the reflowing of the storage node is performed at 650–900° C. in a vacuum state.

16. The method of claim 11, wherein the reflowing of the storage node is performed at 650–900° C. in an oxygen atmosphere.

17. The method of claim 11, wherein an etch stopper is further included between the first dielectric layer and the sacrificial dielectric layer.

18. The method of claim 11, wherein forming the storage node is performed by etch back or chemical-mechanical polishing (CMP).

19. The method of claim 11, wherein the storage node and the upper electrode are formed of a single or composite layer selected from the group consisting of Pt, Ru, Ir, PtO, RuO2, SRO, BSRO, and LSCo.

20. The method of claim 11, wherein filling the storage node hole is performed by one or a combination of a chemical vapor deposition (CVD) method, a physical vapor deposition (PVD) method, and an atomic layer deposition (ALD) method.

21. The method of claim 11, wherein the second dielectric layer is a single or composite layer comprising of at least one selected from the group consisting of a TaON film, a Ta2O5 film, an Al2O3 film, an SrTiO3(STO) film, a (Ba,Sr)TiO3 film, a PbTiO3 film, Pb(Zr,Ti)O3 film, an SrBi2Ta2O9(SBT) film, a (Pb,La)(Zr,Ti)O3 film, and a BaTiO3(BTO) film.

22. The method of claim 11, wherein the second dielectric layer and the upper electrode are formed by the CVD method or ALD method.

23. The method of claim 11 further comprising annealing the semiconductor wafer having the second dielectric layer in an ozone atmosphere between forming the second dielectric layer and forming the upper electrode.

24. The method of claim 11 further comprising processing the semiconductor wafer having the second dielectric layer with plasma in an oxygen or nitrogen atmosphere between forming the second dielectric layer and forming the upper electrode.

25. The method of claim 11 further comprising thermally treating the semiconductor wafer having the second dielectric layer at 500–800° C. in an oxygen or nitrogen atmosphere between forming the second dielectric layer and forming the upper electrode.

26. The method of claim 11 further comprising a step of heating the semiconductor wafer having the upper electrode at 300–600° C. in an oxygen atmosphere after the upper electrode is formed.

27. The method of claim 11 further comprising forming an adhesive layer on the sacrificial dielectric layer when forming the sacrificial dielectric layer including the storage node hole, and removing the adhesive layer as well as the conductive material when forming the storage node.

28. The method of claim 27, wherein the adhesive layer is formed of a film selected from the group consisting of a Ta2O5 film, a TaON film, a TiOx film, a (Ba,Sr)TiO2(BST) film and an SrTiO3 (STO) film.

* * * * *